(12) United States Patent
Park et al.

(10) Patent No.: US 6,884,297 B2
(45) Date of Patent: Apr. 26, 2005

(54) THIN FILM DEPOSITION REACTOR

(75) Inventors: Young Hoon Park, Pyungtaek (KR); Choon Kum Baik, Pyungtaek (KR); Hong Joo Lim, Pyungtaek (KR); Ho Seung Chang, Pyungtaek (KR)

(73) Assignee: IPS Ltd. (KR)

( * ) Notice: Subject to any disclaimer, the term of this patent is extended or adjusted under 35 U.S.C. 154(b) by 0 days.

(21) Appl. No.: 10/804,912

(22) Filed: Mar. 19, 2004

(65) Prior Publication Data

US 2004/0187780 A1 Sep. 30, 2004

(30) Foreign Application Priority Data

Mar. 31, 2003 (KR) .................................. 10-2003-0019960

(51) Int. Cl.[7] ....................... C23C 16/00; C23C 16/455
(52) U.S. Cl. .................................. 118/715; 156/345.29
(58) Field of Search ....................... 118/715; 156/345.29

(56) References Cited

U.S. PATENT DOCUMENTS

| | | | | |
|---|---|---|---|---|
| 5,935,338 A | * | 8/1999 | Lei et al. ...................... | 118/725 |
| 6,117,244 A | * | 9/2000 | Bang et al. ................... | 118/715 |
| 6,120,605 A | * | 9/2000 | Sato ............................ | 118/715 |
| 6,183,563 B1 | * | 2/2001 | Choi et al. ................... | 118/715 |
| 6,364,954 B2 | * | 4/2002 | Umotoy et al. .............. | 118/715 |
| 6,402,848 B1 | * | 6/2002 | Horiguchi et al. ........... | 118/715 |
| 6,582,522 B2 | * | 6/2003 | Luo et al. .................... | 118/715 |
| 6,586,343 B1 | * | 7/2003 | Ho et al. ...................... | 438/758 |
| 6,656,838 B2 | * | 12/2003 | Watanabe et al. ............ | 438/680 |
| 6,802,906 B2 | * | 10/2004 | Jin et al. ...................... | 118/715 |
| 2002/0023588 A1 | * | 2/2002 | Yamamuka et al. ......... | 118/715 |
| 2003/0041971 A1 | * | 3/2003 | Kido et al. ............. | 156/345.33 |
| 2003/0221780 A1 | * | 12/2003 | Lei et al. ............... | 156/345.29 |
| 2004/0149212 A1 | * | 8/2004 | Cho et al. .................... | 118/715 |
| 2004/0187780 A1 | * | 9/2004 | Park et al. ................... | 118/715 |

* cited by examiner

*Primary Examiner*—Jeffrie R. Lund
(74) *Attorney, Agent, or Firm*—Cantor Colburn LLP

(57) ABSTRACT

Provided is a thin film deposition reactor, including a reactor block having a deposition space, a wafer block, a top lid for covering and sealing the reactor block, a showerhead for spraying a reaction gas on the wafer block, and an exhaust line through which gases are exhausted from the reactor block. A lower pumping baffle and an upper pumping baffle are stacked on a bottom of the reactor block between an outer circumference of the wafer block and an inner circumference of the reactor block. A lower pumping region is formed between the lower pumping baffle and an inner sidewall of the reactor block. An upper pumping region is formed between the upper pumping baffle and the inner sidewall of the reactor block. The deposition space is connected to the upper pumping region by a plurality of upper pumping holes formed in the upper pumping baffle, and the upper pumping region is connected to the lower pumping region by a plurality of lower pumping holes formed in the lower pumping baffle. The lower pumping region is connected to the exhaust line.

4 Claims, 5 Drawing Sheets

THIN FILM DEPOSITION REACTOR

This application claims the priority of Korean Patent Application No. 2003-19960, filed on Mar. 31, 2003, in the Korean Intellectual Property Office, the disclosure of which is incorporated herein by reference in its entirety.

BACKGROUND OF THE INVENTION

1. Field of the Invention

The present invention relates to a thin film deposition reactor with an improved exhaust structure.

2. Description of the Related Art

Different reaction gases are simultaneously or alternately sprayed on a wafer loaded in a conventional reactor to form a thin film on the wafer, such that the thin film contains few impurities and has excellent electrical characteristics and a uniform thickness. As the number of processed wafers increases, while a thin film is being deposited on a wafer, the accumulation of powder in the reactor should be minimized. Also, an excellent exhaust structure is required since remaining byproduct gases may adversely affect deposition of a thin film on a subsequent wafer loaded in the reactor. That is, sufficient pumping conductance of reaction gases is required.

SUMMARY OF THE INVENTION

The present invention provides a thin film deposition reactor with an improved exhaust structure, which can effectively exhaust non-reacted gases in order to deposit a thin film having a uniform thickness and excellent electrical characteristics on a wafer.

According to an aspect of the present invention, there is provided a thin film deposition reactor, comprising a reactor block; a wafer block; a top lid; a showerhead; and an exhaust line. The reactor block has a deposition space, and a wafer is mounted on the wafer block. The top lid covers and seals the reactor block. The showerhead is disposed under the top lid and sprays a reaction gas on the wafer block. Also, the exhaust line is disposed in a lower portion of the reactor block, and gases are exhausted from the reactor block through the exhaust line. A lower pumping baffle and an upper pumping baffle are stacked on a bottom of the reactor block between an outer circumference of the wafer block and an inner circumference of the reactor block. A lower pumping region is formed between the lower pumping baffle and an inner sidewall of the reactor block. An upper pumping region is formed between the upper pumping baffle and the inner sidewall of the reactor block. The deposition space is connected to the upper pumping region by a plurality of upper pumping holes formed in the upper pumping baffle. The upper pumping region is connected to the lower pumping region by a plurality of lower pumping holes formed in the lower pumping baffle. Also, the lower pumping region is connected to the exhaust line.

An over-pressurized gas inlet line can be disposed in a lower portion of the reactor block and allow the inflow of an over-pressurized gas to prevent the reaction gas from flowing below the wafer block. Also, a plurality of exhaust holes can be formed in inner sidewalls of the lower pumping baffle and allow the over-pressurized gas to flow into the exhaust line.

The lower pumping region can be connected to the exhaust line by a single connection port formed in a bottom of the reactor block.

The thin film deposition reactor can further comprise a cylindrical chamber insertion stacked on the upper pumping baffle. The chamber insertion can have a gate groove, through which a wafer is loaded and unloaded, and contact the inner sidewall of the reactor block adjacent to an upper portion of the upper pumping baffle.

BRIEF DESCRIPTION OF THE DRAWINGS

The above object and advantages of the present invention will become more apparent by describing in detail exemplary embodiments thereof with reference to the attached drawings in which.

DETAILED DESCRIPTION OF THE INVENTION

The present invention will now be described more fully with reference to the accompanying drawings, in which exemplary embodiments of the invention are shown.

Figure 1:
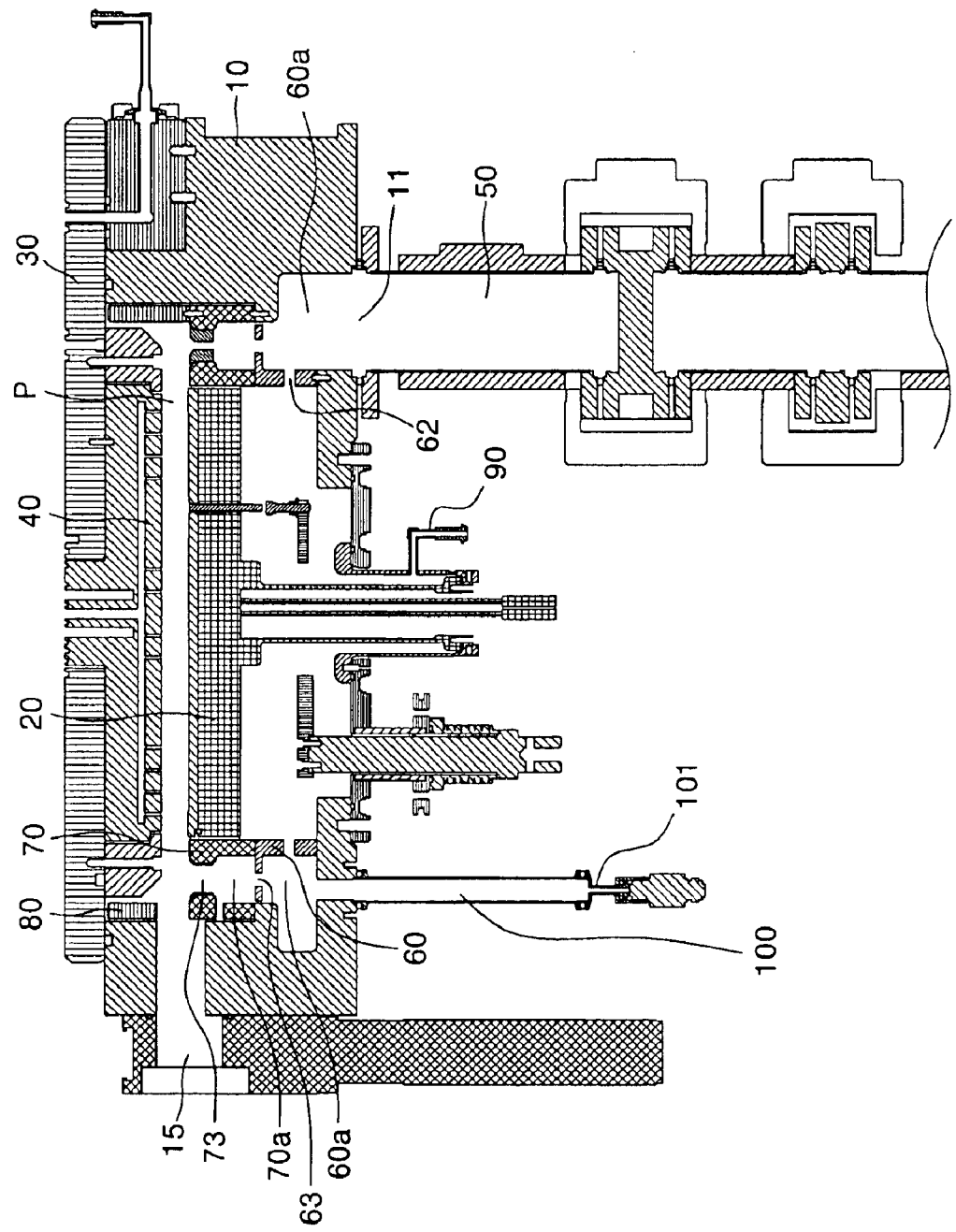
FIG. 1 is a cross-sectional view of a thin film deposition reactor according to the present invention.
Figure 2:
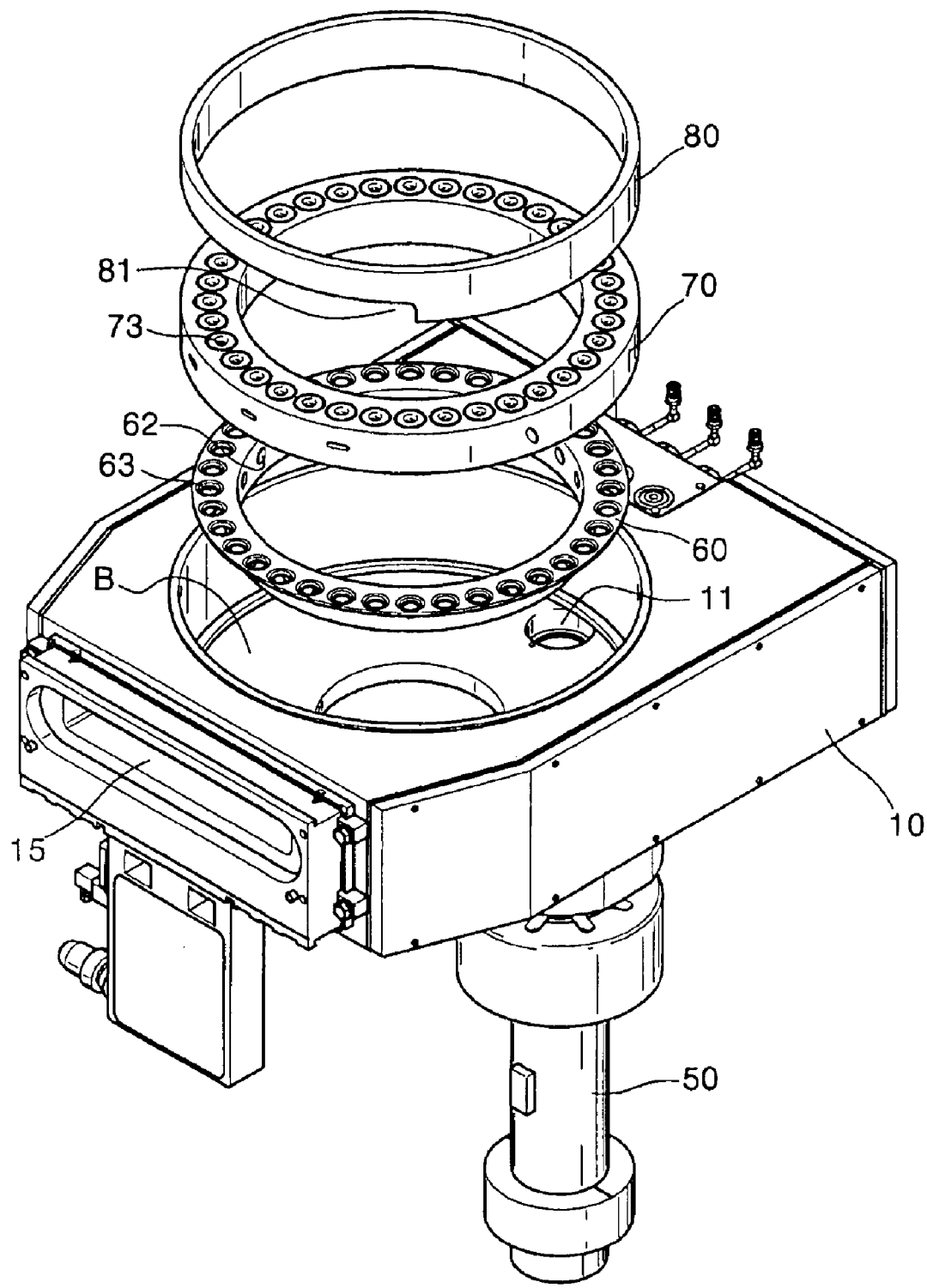
FIG. 2 is a perspective view of a lower pumping baffle, an upper pumping baffle, and a chamber insertion shown in FIG. 1.
Figure 3:
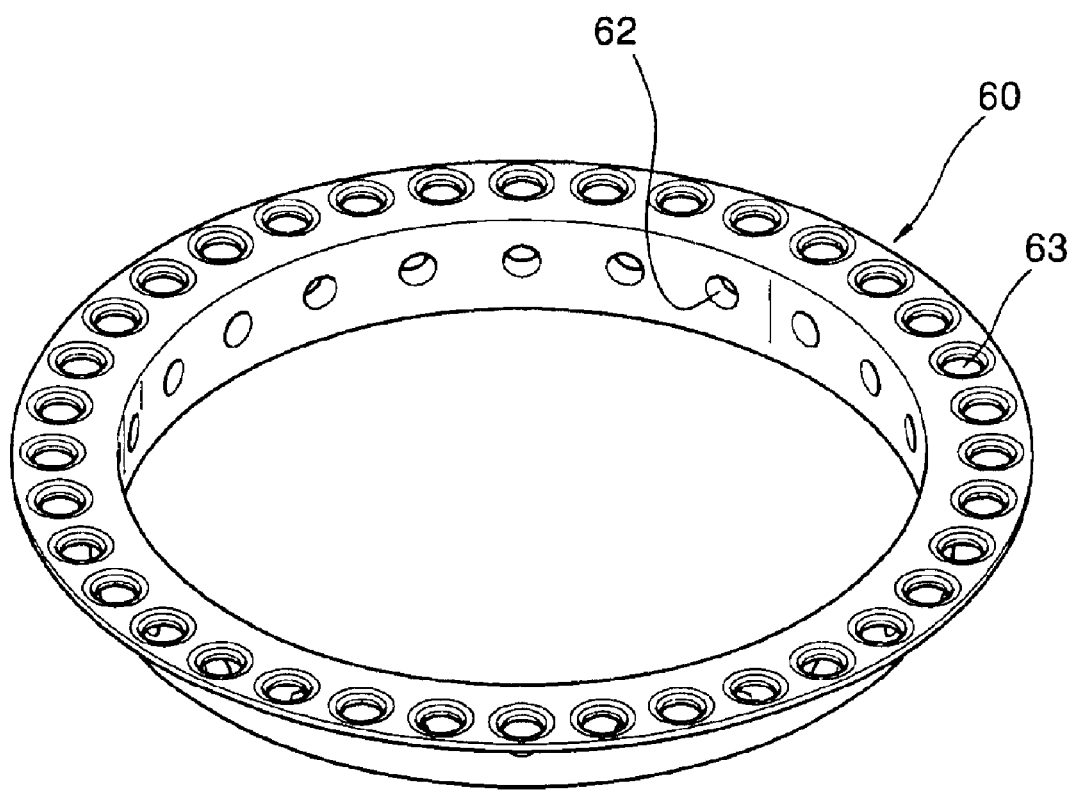
FIG. 3 is a detailed perspective view of the lower pumping baffle shown in FIG. 2.
Figure 4:
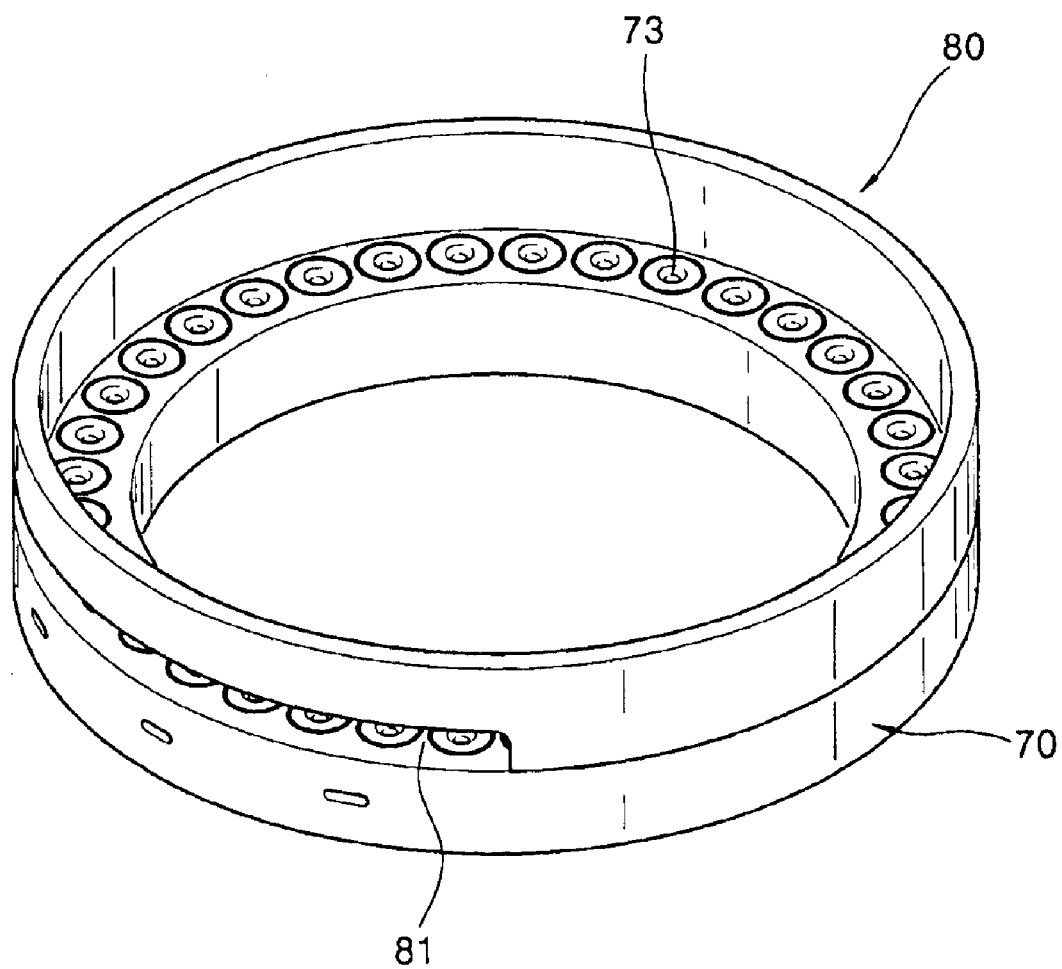
FIG. 4 is a partial perspective view of a stack of the upper pumping baffle and the chamber insertion shown in FIG. 2.
Figure 5:
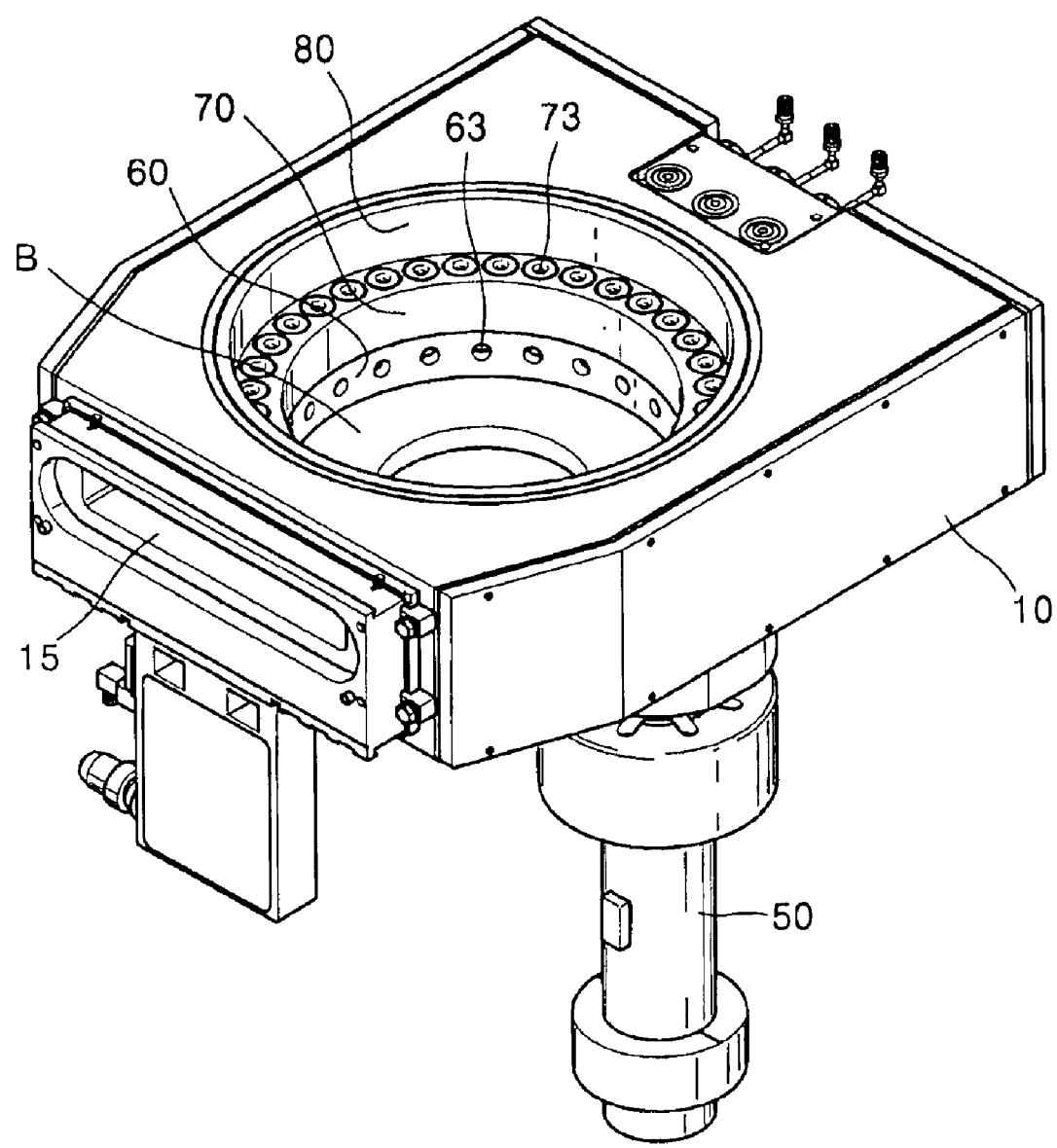
FIG. 5 is a perspective view of a thin film deposition reactor of FIG. 1.

FIG. 1 is a cross-sectional view of a thin film deposition reactor according to the present invention, FIG. 2 is a perspective view of a stack of a lower pumping baffle, an upper pumping baffle, and a chamber insertion shown in FIG. 1, FIG. 3 is a detailed perspective view of the lower pumping baffle shown in FIG. 2, FIG. 4 is a partial perspective view of a stack of the upper pumping baffle and the chamber insertion shown in FIG. 2, and FIG. 5 is a perspective view of a thin film deposition reactor of FIG. 1.

Referring to FIG. 1, a thin film deposition reactor comprises a reactor block 10, a wafer block 20, a top lid 30, a showerhead 40, and an exhaust line 50. The reactor block 10 includes a deposition space P, and the wafer block 20, where a wafer W is mounted, is disposed in the reactor block 10. The top lid 30 covers and seals the reactor block 10. The showerhead 40 is located below the top lid 30 and sprays reaction gases toward the wafer block 20. The exhaust line 50 is disposed below the reactor block 10 and exhausts gases from the reactor block 10. Referring to FIG. 2, a lower pumping baffle 60 is mounted on a bottom B of the reactor block between an outer circumference of the wafer block 20 and an inner circumference of the reactor block 10, and an upper pumping baffle 70 is stacked on the lower pumping baffle 60. A cylindrical chamber insertion 80 having a gate groove 81, through which the wafer W is loaded and unloaded, is stacked on the upper pumping baffle 70 such that it contacts an inner sidewall of the reactor block 10.

The exhaust line 50 is connected to the lower pumping baffle 60 by a single connection port 11 formed in a lower portion of the reactor block 10.

As shown in FIG. 3, the lower pumping baffle 60 is formed of two connected portions, i.e., an annular portion having a plurality of lower pumping holes 63 and a cylindrical portion having a plurality of exhaust holes 62. An over-pressurized gas is injected from an over-pressurized gas inlet line 90 to a lower pumping region 60a via the exhaust holes 62. The over-pressurized gas can prevent a reaction gas from flowing below the wafer block 20.

The upper pumping baffle 70 is stacked on the lower pumping baffle 60, and a plurality of upper pumping holes 73, each having the same diameter, are formed in the upper pumping baffle 70 as shown in FIG. 4. The upper pumping holes 73 are formed in insertions, which are additionally combined with a plurality of combination holes (not shown) formed in the upper pumping baffle 70. However, the upper pumping holes 73 can be formed by processing the upper pumping baffle 70 instead of using the insertions.

An upper pumping region 70a is formed between the upper pumping baffle 70 and an inner wall of the reactor block 10, and a lower pumping region 60a is formed between the lower pumping baffle 60 and the inner wall of the reactor block 10.

An over-pressurized gas inlet line 90 is disposed at a lower end of the reactor block 10. The over-pressurized gas inlet line 90 allows the inflow of an over-pressurized gas to prevent a reaction gas from flowing below the wafer block 20. The over-pressurized gas that enters the over-pressurized gas inlet line 90 flows through the exhaust holes 62 and the lower pumping region 60a into the exhaust line 50. Thus, the reaction gas that flows into the reactor block 10 has minimal flow below the wafer block 20. This prevents deposition of an undesired thin film on a lower portion of the wafer block 20 due to the reaction gas.

Thus, the deposition space P is connected to the upper pumping region 70a by the plurality of upper pumping holes 73 formed in the upper pumping baffle 70, the upper pumping region 70a is connected to the lower pumping region 60a by the plurality of lower pumping holes 63 formed in the lower pumping baffle 60, and the lower pumping region 60a is connected to the exhaust line 50.

The chamber insertion 80 is stacked on the upper pumping baffle 70, and an outer circumference of the chamber insertion 80 contacts the inner circumference of the reactor block 10 adjacent to an upper portion of the upper pumping baffle 70. The chamber insertion 80 prevents sidewalls of the reactor block 10 from being damaged by erosive gases. A wafer W is loaded via a wafer transfer slit 15 and is transferred to the wafer block 20 through the gate groove 81 formed in a lower portion of the chamber insertion 80.

As shown in FIG. 1, a multi-port line 100 and a multi-port 101 may be installed in the reactor block 10. The multi-port 101 is used to analyze ingredients of a thin film deposited in the reactor block 10 or as a supply line for supplying He gas to rapidly lower the temperature of the reactor block 10.

When the above-described thin film deposition reactor is used, a wafer W is mounted on the wafer block 20 and preheated for a predetermined amount of time.

After the wafer W is sufficiently preheated, a reaction gas and/or inert gas is simultaneously or alternately sprayed via the showerhead 40 such that a thin film is deposited on the wafer W. To prevent deposition of an undesired thin film on the lower portion of the wafer block 20 due to the reaction gas, an over-pressurized gas flows into the reactor block 10 via the over-pressurized gas inlet line 90. Preferably, the over-pressurized gas is an inert gas. The over-pressurized gas flows through the exhaust holes 62 of the lower pumping baffle 60 into the exhaust line 50. Thus, the reaction gas sprayed from the showerhead 40 or a byproduct gas cannot flow below the wafer block 20, and the undesired thin film is not formed on the lower portion of the wafer block 20.

As described above, the thin film deposition reactor of the present invention improves efficiency of exhausting a reaction gas, thereby reducing pumping time. Thus, a time required to load a subsequent wafer into the reactor is decreased. Also, as the number of processed wafers increases, a high degree of purity of a thin film can be maintained in spite of unexhausted byproduct gases.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A thin film deposition reactor comprising:

a reactor block having a deposition space;

a wafer block on which a wafer is mounted;

a top lid for covering and sealing the reactor block;

a showerhead disposed under the top lid, the showerhead for spraying a reaction gas on the wafer block; and an exhaust line disposed in a lower portion of the reactor block, the exhaust line through which gases are exhausted from the reactor block, wherein a lower pumping baffle and an upper pumping baffle are stacked on a bottom of the reactor block between an outer circumference of the wafer block and an inner circumference of the reactor block, a lower pumping region is formed between the lower pumping baffle and an inner sidewall of the reactor block, and an upper pumping region is formed between the upper pumping baffle and the inner sidewall of the reactor block, wherein the deposition space is connected to the upper pumping region by a plurality of upper pumping holes formed in the upper pumping baffle, wherein the upper pumping region is connected to the lower pumping region by a plurality of lower pumping holes formed in the lower pumping baffle, and wherein the lower pumping region is connected to the exhaust line.

2. The reactor of claim 1, further comprising an over-pressurized gas inlet line disposed in a lower portion of the reactor block, the over-pressurized gas inlet line for allowing an inflow of an over-pressurized gas to prevent the reaction gas from flowing below the wafer block, wherein a plurality of exhaust holes are formed in inner sidewalls of the lower pumping baffle and allow the over-pressurized gas to flow into the exhaust line.

3. The reactor of claim 1, wherein the lower pumping region is connected to the exhaust line by a single connection port formed in a bottom of the reactor block.

4. The reactor of claim 1, further comprising a cylindrical chamber insertion stacked on the upper pumping baffle and having a gate groove through which a wafer is loaded and unloaded, the chamber insertion contacting the inner sidewall of the reactor block adjacent to an upper portion of the upper pumping baffle.

\* \* \* \* \*